United States Patent
Sohn

(10) Patent No.: US 6,949,467 B2
(45) Date of Patent: Sep. 27, 2005

(54) FORMING METHOD OF CONTACT IN SEMICONDUCTOR DEVICE AND MANUFACTURING METHOD OF PMOS DEVICE USING THE SAME

(75) Inventor: Yong-Sun Sohn, Ichon-shi (KR)

(73) Assignee: Hynix Semiconductor Inc., Ichon-shi (KR)

(*) Notice: Subject to any disclaimer, the term of this patent is extended or adjusted under 35 U.S.C. 154(b) by 268 days.

(21) Appl. No.: 10/319,657

(22) Filed: Dec. 16, 2002

(65) Prior Publication Data

US 2004/0058548 A1 Mar. 25, 2004

(30) Foreign Application Priority Data

Sep. 24, 2002 (KR) ............................... 10-2002-0057761

(51) Int. Cl.$^7$ ........................................... H01L 21/302
(52) U.S. Cl. ................... 438/694; 438/696; 438/700; 438/715; 438/719
(58) Field of Search ............................. 438/694, 696, 438/700, 715, 719

(56) References Cited

U.S. PATENT DOCUMENTS

| 6,117,773 A | * | 9/2000 | Sim ........................... 438/683 |
| 6,794,279 B1 | * | 9/2004 | Stephen et al. ............. 438/585 |

FOREIGN PATENT DOCUMENTS

| KR | 1997-18231 | 4/1997 | ....... H01L/21/3205 |
| KR | 02-32344 | 5/2002 | ......... H01L/21/265 |

OTHER PUBLICATIONS

Dong–Ho Lee, et al.; *High quality shallow p+ -n junction formation by employing $BF_2$/low energy $_{11}B$ mixed ion implant process*; 0-7803-4538-X/99$10.00; 1999 IEEE; pp. 83–86.

Yong–Sun Sohn, et al; *BF2+/11B+ Mixed Ion Implantation for P+ Shallow Junction Formation;* Fabrication and Characterization of Advanced Materials; 1995; pp. 1087–1092.

* cited by examiner

Primary Examiner—Nadine G. Norton
Assistant Examiner—Binh X. Tran
(74) Attorney, Agent, or Firm—Mayer, Brown, Rowe & Maw LLP

(57) ABSTRACT

The present invention provides a manufacturing method of a contact for use in a semiconductor device and a manufacturing method of a PMOS device using the same, which can obtain an electrical characteristic of a low contact resistance similar to a mixed implantation of $_{49}BF_2^+$ ions and $_{11}B^+$ ions and reduce a manufacturing cost. The method for forming a contact of a semiconductor device includes: the steps of: forming an insulating layer on a conductive semiconductor layer; forming a contact hole within the insulating layer to expose a portion of the conductive semiconductor layer; forming a plug implantation region by implanting $_{30}BF^+$ ions into the exposed conductive semiconductor layer disposed on a bottom of the contact hole; performing an annealing process for activating dopants injected by the implantation of $_{30}BF^+$ ions; and filling the contact hole with a conductive layer.

12 Claims, 11 Drawing Sheets

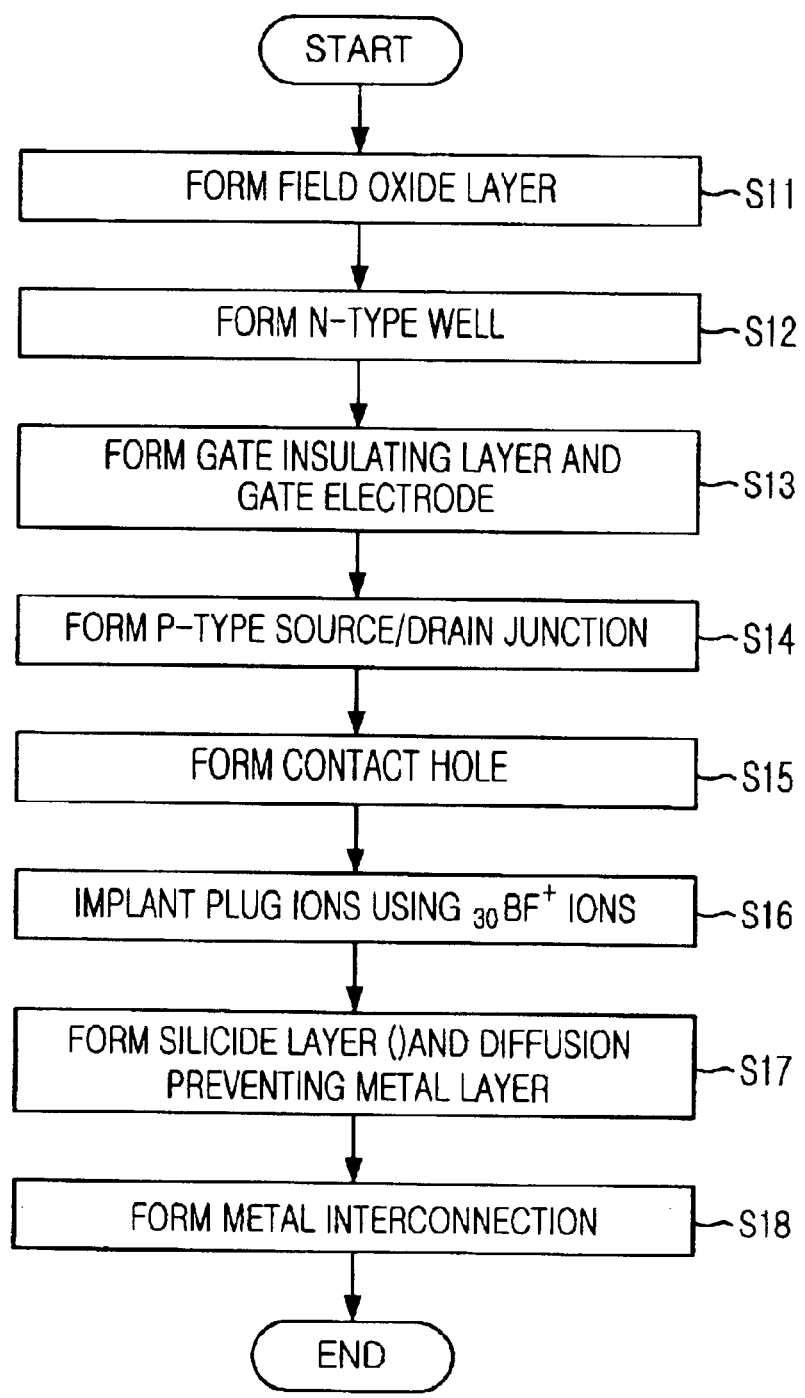

FORMING METHOD OF CONTACT IN SEMICONDUCTOR DEVICE AND MANUFACTURING METHOD OF PMOS DEVICE USING THE SAME

FIELD OF THE INVENTION

The present invention relates to a manufacturing technique of a semiconductor device and, more particularly, to a manufacturing method of a semiconductor device, which is capable of reducing a contact resistance and a manufacturing cost.

DESCRIPTION OF THE PRIOR ART

In memory devices of 0.15 μm or more, a size of a contact hole for connecting a source/drain junction of a PMOS device with a metal interconnection is 0.04 μm$^2$ or more. Therefore, it is possible to satisfy a desired contact resistance between the metal interconnection and the source/drain junction using a typical method for forming a contact hole. Meanwhile, in high integration memory devices of 0.15 μm or less, since a size of a contact hole is very small, i.e., 0.04 μm$^2$ or less, a contact resistance can be secured by performing an additional ion implantation process after forming the source/drain junction and the contact hole.

The additional ion implantation process is also called a "plug implantation process". Generally, in the process of forming a metal contact of the semiconductor device, in order to improve the contact resistance of junctions after forming the contact hole on the source/drain junction and before forming the metal interconnection, the additional ion implantation process is performed using the same dopants as the source/drain junction.

For example, in case of the PMOS device, a conventional plug implantation process is performed by implanting $_{49}BF_2^+$ and $_{11}B^+$ ions into the source/drain junction. An object of the plug implantation process is to compensate for an etching damage of the source/drain junction when the contact hole is formed on the source/drain junction, to reduce a junction leakage current caused due to a substrate damage in an etching process, to prevent a dopant damage to silicide in a process of forming the silicide among processes of the metal interconnection, and to prevent an increase of the contact resistance according to the dopant damage.

The plug implantation process using only $_{49}BF_2^+$ ion is advantageous to a diffusion prevention of boron (B) ions due to fluorine (F) ions. However, since excessive fluorine (F) ions cause fluorine and silicon compounds and precipitates to be formed on a surface of the substrate within the contact hole during an annealing process, an uniform formation of silicide layers is prevented, resulting in an increase of the contact resistance and ununiformity.

The plug implantation process using only $_{11}B^+$ ions cause a problem of a channeling phenomenon of boron ion having small mass and a problem of deepening the previously formed source/drain junction due to a transient enhanced diffusion (TED).

Therefore, in case where $_{49}BF_2^+$ ions or $_{11}B^+$ ions are implanted, the plug implantation is not suitable for obtaining small contact resistance required in the high integration device.

Meanwhile, in order to improve the problem caused in case of the plug implantation process using only $_{11}B^+$ ions, there is proposed a method of implanting $_{11}B^+$ ions after a pre-amorphization process through an implantation of germanium (Ge) or silicon (Si) ions.

However, since the pre-amorphization process is carried out by implanting boron (B) ions under a low energy after performing the pre-amorphization process using the implantation of germanium (Ge) ions or silicon (Si) ions, ion source region of an ion injector may be contaminated during the implantation of germanium (Ge) ions or silicon (Si) ions, so that it is necessary to frequently inspect the ion injector. Further, since a high manufacturing cost may be caused due to a problem of productivity in the implantation of boron (B) ions under the low energy may be caused, so that it is not suitable for manufacturing the memory devices.

To improve these problems, a mixed implantation process using $_{49}BF_2^+$ ions and $_{11}B^+$ ions is proposed. In other words, the mixed implantation process has a small implantation amount of fluorine (F) and is used in source/drain junction ion implantation or plug ion implantation.

FIGS. 1A to 1C are cross-sectional diagrams showing a manufacturing method of a conventional PMOS device using a mixed implantation of $_{49}BF_2^+$ and $_{11}B^+$ ions.

Referring to FIG. 1A, a field oxide layer 12 acting as a device isolation layer is formed on a predetermined portion of a semiconductor substrate 11. Then, N-type well 13 defining a PMOS region is formed within the semiconductor substrate 11, and a gate structure including a gate insulating layer 14 and a gate electrode 15 is formed on a selected portion of the semiconductor substrate 11 using well-known methods.

After depositing an insulating layer on the semiconductor substrate 11, an etching process is performed to an entire surface to thereby form spacers 16 on both sidewalls of the gate electrode 15.

Then, P-type source/drain junction 17 is formed by implanting P-type dopants (e.g., $_{49}BF_2^+$ ions or $_{11}B^+$ ions) into the semiconductor substrate 11 disposed at outer sides of the spacers 16. At this time, the P-type source/drain junction 17 has a source-drain extension (SDE) structure, and the SDE structure can be formed through an ion implantation before forming the spacers 16.

Thereafter, after depositing an intermediate insulating layer 18 on the semiconductor substrate 11, a photoresist pattern 19 for exposing the P-type source/drain junction 17 si formed on the intermediate insulating layer 18 using a well-known photolithography method. Then, the intermediate insulating layer 18 is etched using the photoresist pattern 19 as an etching mask to thereby form a contact hole 20. At this time, during the etching process for forming the contact hole 20, a predetermined portion of a surface of the P-type source/drain junction 17 or a surface of the semiconductor substrate 11 may be damaged.

Then, in order to cure the damaged portion of the P-type source/drain junction 17 and secure the contact resistance, a plug implantation region 21 is formed by performing the plug implantation process. Primarily, $_{49}BF_2^+$ ions are implanted to amorphize the surface of the P-type source/drain junction 17.

Referring to FIG. 1B, secondarily, $_{11}B^+$ ions are implanted into the P-type source/drain junction 17. Consequently, the plug implantation region 21 is a region into which $_{49}BF_2^+$ ions and $_{11}B^+$ ions are implanted.

Referring to FIG. 1C, after removing the photoresist pattern 19, a stack layer composed of a silicide layer 22 and a diffusion preventing metal layer 23 is formed, in which the silicide layer 23 is contacted with the exposed P-type source/drain junction 17. Then, a metal interconnection 24 is formed. For example, the silicide layer 22 is a titanium silicide layer formed by depositing a titanium layer and then reacting with the semiconductor substrate 11. The diffusion preventing metal layer 23 is a titanium nitride (TiN) layer or a stack layer composed of a titanium (Ti) layer and a titanium nitride layer.

According to the prior art, an amorphous layer or a crystalline defect layer capable of minimizing a channeling phenomenon during following implantation of $_{11}B^+$ ions is formed by previously implanting $_{49}BF_2^+$ ions of a total implanting amount required in the plug implantation process, and then the other required amount is implanted using $_{11}B^+$ ions. It is well known that such a mixed implantation process is devised as a countermeasure technique for the pre-amorphization process, and it can more remarkably improve productivity compared with the pre-amorphization process.

Since the above-described mixed implantation process of $_{49}BF_2^+$ ions and $_{11}B^+$ ions causes the source/drain junction with fluorine amount of low concentration or the plug implantation region to be formed, it is advantage to the dopant activation and the formation of the silicide layer for the contact. As a result, there are advantages that the contact resistance is reduced and an on-current of the PMOS device is increased.

However, during the following ion implantation process, i.e., $_{11}B^+$ ion implantation process, since a low energy ion implantation of 5 KeV or less is required, there is a disadvantage that a manufacturing cost is still increased.

SUMMARY OF THE INVENTION

It is, therefore, an object of the present invention to provide a manufacturing method of a contact for use in a semiconductor device and a manufacturing method of a PMOS device using the same, which can obtain an electrical characteristic of a low contact resistance similar to a mixed implantation and reduce a manufacturing cost.

In accordance with an aspect of the present invention, there is provided a method for forming a contact of a semiconductor device, which comprises the steps of: forming an insulating layer on a conductive semiconductor layer; forming a contact hole within the insulating layer to expose a portion of the conductive semiconductor layer; forming a plug implantation region by implanting $_{30}BF^+$ ions into the exposed conductive semiconductor layer disposed on a bottom of the contact hole; performing an annealing process for activating dopants injected by the implantation of $_{30}BF^+$ ions; and filling the contact hole with a conductive layer.

Further, in accordance with another aspect of the present invention, there is provided a method for forming a contact of a semiconductor device, which comprises the steps of: forming an insulating layer on a conductive semiconductor layer; forming a contact hole within the insulating layer to expose a portion of the conductive semiconductor layer; forming a plug implantation region by implanting $_{30}BF^+$ ions into the exposed conductive semiconductor layer disposed on a bottom of the contact hole; sequentially forming a metal layer for forming a silicide within the contact hole and a diffusion preventing metal layer; forming a silicide layer contacted with the plug implantation region by performing an annealing process and simultaneously activating dopants implanted into the plug implantation region; and filling the contact hole with a conductive layer.

Furthermore, in accordance with further another embodiment of the present invention, there is provided a method for manufacturing a PMOS device, wherein comprises the steps of: forming a P-type source/drain junction on a semiconductor substrate; forming an insulating layer on the semiconductor substrate; etching the insulating layer to form a contact hole exposing the P-type source/drain junction; implanting $_{30}BF^+$ ions into the exposed P-type source/drain junction within the contact hole; forming a silicide layer and a diffusion preventing metal layer within the contact hole; and forming a metal interconnection electrically connected the P-type source/drain junction on the diffusion preventing metal layer within the contact hole.

BRIEF DESCRIPTION OF THE DRAWINGS

Other objects and aspects of the invention will become apparent from the following description of the embodiments with reference to the accompanying drawings, in which:

FIG. 3 is a flowchart showing a manufacturing method of a PMOS device in accordance with a second embodiment of the present invention;

DETAILED DESCRIPTION OF THE PREFERRED EMBODIMENTS

Hereinafter, preferred embodiments of the present invention will be descried in detail with reference to attached drawings.

Figure 1A:
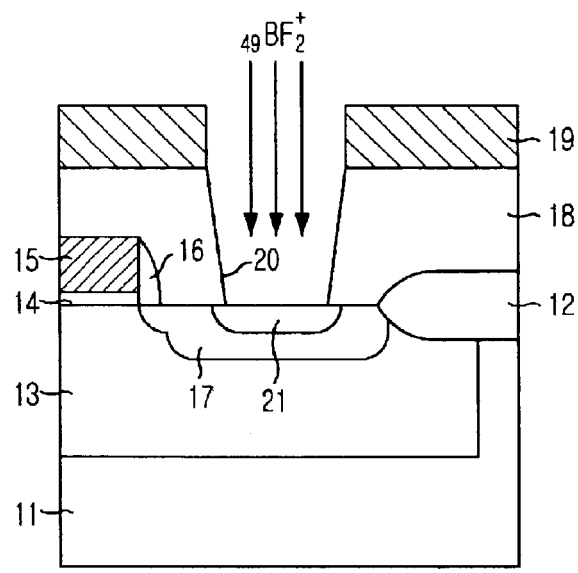
FIGS. 1A to 1C are cross-sectional diagrams showing a manufacturing method of a conventional PMOS device using a mixed implantation of $_{49}BF_2^+$ ions and $_{11}B^+$ ions.
Figure 1B:
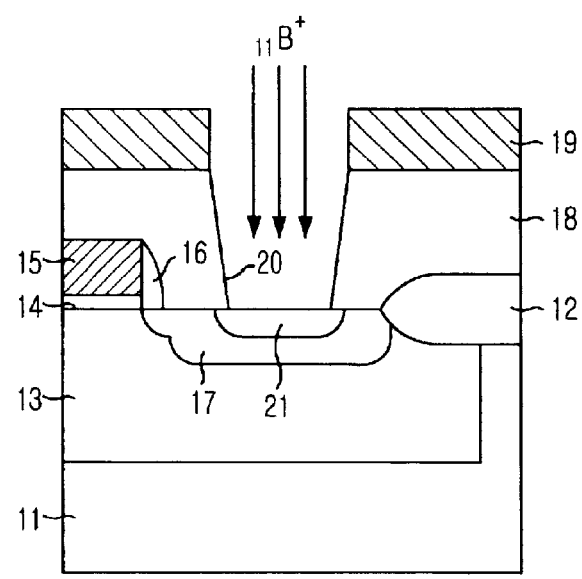
Figure 1C:
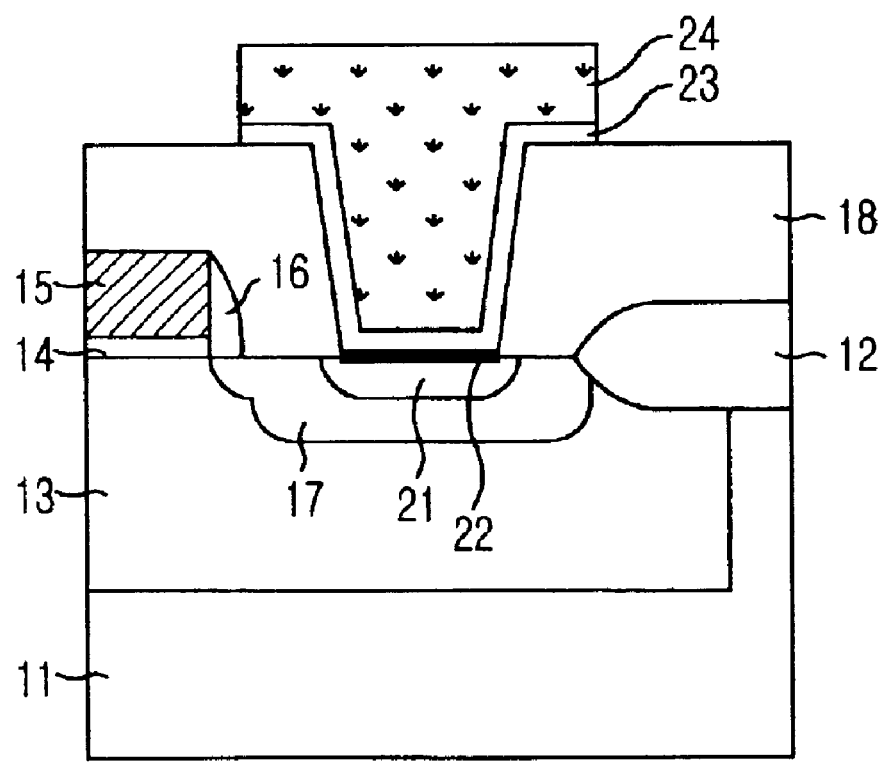
Figure 2:
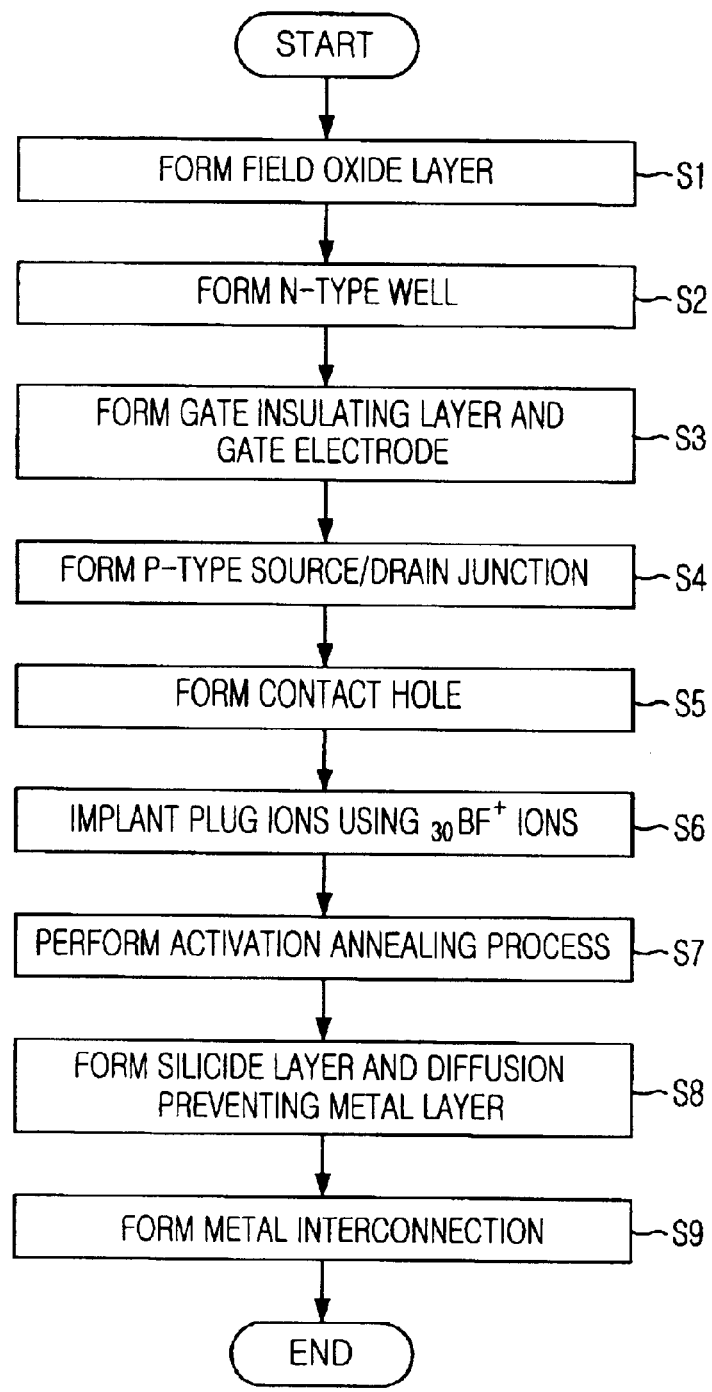
FIG. 2 is a flowchart showing a manufacturing method of a PMOS device in accordance with a first embodiment of the present invention.

FIG. 2 is a flowchart showing a manufacturing method of a PMOS device in accordance with a first embodiment of the present invention.

Referring to FIG. 2, the manufacturing method of the PMOS device includes the step S1 of forming a field oxide layer, the step S2 of forming an N-type well, the step S3 of forming a gate insulating layer and a gate electrode, the step S4 of forming a P-type source/drain junction, the step S5 of forming a contact hole, the step S6 of performing a plug implantation process using $_{30}BF^+$ ions, the step S7 of performing a activation annealing process, the step S8 of forming a silicide layer and a diffusion preventing metal layer, and the step S9 of forming a metal interconnection.

In FIG. 2, the step S1 of forming the field oxide layer is achieved through STI or LOCOS process, and the step S2 of forming the N-type well is achieved by implanting N-type dopants such as phosphorous (P) ions. In the step S3 of forming the gate insulating layer and the gate electrode, the gate insulating layer is formed using any one of a thermal oxide layer, an oxynitride layer, a high dielectric layer and a stack layer of oxide layer/high dielectric layer. The gate electrode is formed using any one of a polysilicon layer, a stack layer of polysilicon layer/silicide layer, a stack layer of polysilicon layer/metal layer, a silicon germanium layer, a stack layer of silicon germanium layer/metal layer, and a metal layer.

The step S4 of forming the P-type source/drain junction is achieved through any one of $_{49}BF_2^+$ ion implantation process, $_{11}B^+$ ion implantation process, a mixed implantation of $_{49}BF_2^+$ ions and $_{11}B^+$ ions, and $_{30}BF^+$ ion implantation process.

The step S5 of forming the contact hole is a process of exposing a portion of the P-type source/drain junction by etching an intermediate insulating layer.

The step S6 of performing the plug implantation process using $_{30}BF^+$ ions is a process of forming a plug implantation region on the exposed P-type source/drain junction by implanting $_{30}BF^+$ ions. The plug implantation process has an electrical characteristic of a low contact resistance similar to the mixed implantation of $_{49}BF_2^+$ and $_{11}B^+$ ions and can reduce a manufacturing cost.

The step S7 of performing the activation annealing process is an annealing process for electrically activating the dopants after the plug implantation process. 40% or more of fluorine (F) ions implanted during the plug implantation process are emitted to an exterior during the annealing process.

The step S8 of forming the silicide layer and the diffusion preventing metal layer is a process of forming the silicide layer so as to easily form an ohmic contact and forming the diffusion preventing metal layer so as to prevent a mutual diffusion between the P-type source/drain junction and the metal interconnection. The step S8 includes an annealing process for forming the silicide layer.

Finally, the step S9 of forming the metal interconnection is a process of forming the metal interconnection to be connected with the P-type source/drain junction. The metal interconnection is formed by depositing any one of aluminum, aluminum alloy, tungsten, copper and copper ally on the diffusion preventing metal layer and then patterning the deposited layer.

FIG. 3 is a flowchart showing a manufacturing method of a PMOS device in accordance with a second embodiment of the present invention.

Referring to FIG. 3, the manufacturing method of the PMOS device includes the step S11 of forming a field oxide layer, the step S12 of forming an N-type well, the step S13 of forming a gate insulating layer and a gate electrode, the step S14 of forming a P-type source/drain junction, the step S15 of forming a contact hole, the step S16 of performing a plug implantation process using $_{30}BF^+$ ions, the step S17 of forming a silicide layer (in which the dopants implanted during the plug implantation process are activated at the annealing process) and a diffusion preventing metal layer, and the step S18 of forming a metal interconnection.

In FIG. 3, the steps S11 to S16 and S18 are the same as the first embodiment of the present invention described in FIG. 2.

However, unlike the first embodiment of the present invention in which the step S7 of performing the activation annealing process is carried out after the step S6 of performing the plug implantation process using $_{30}BF^+$ ions, the second embodiment of the present invention activates the dopants, which are implanted during the plug implantation process, in the step S17 of forming the silicide layer and the diffusion preventing metal layer. In other words, the dopants implanted during the plug implantation are activated in the annealing process for forming the silicide layer.

Accordingly, compared with the first embodiment, the second embodiment of the present invention can omit the activation annealing process, so that a thermal burden is reduced due to multiple annealing processes.

In FIGS. 2 and 3, $_{30}BF^+$ ions applied during the plug implantation process are ions extracted by selecting a mass of 30 through a mass fractionator in an extraction operation of ion beams using $BF_3$ gas. $_{30}BF^+$ ion has half the bonding number of fluorine as many as $_{49}BF_2^+$ ion. Also, since $_{30}BF^+$ ion has half the implantation amount as much as $_{49}BF_2^+$ ion, it is possible to prevent occurrence of precipitates of fluorine compounds and fluorine bubbles remained due to excessive implantation of fluorine after a following annealing process.

Accordingly, through an implantation of $_{30}BF^+$ ions, it is possible to form the contact or the source/drain junction containing a small amount of fluorine ions, which is similar to the mixed implantation of $_{49}BF_2^+$ ions and $_{11}B^+$ ions. Thus, it is possible to prevent an obstacle of forming a silicide layer and a ununiformity of contact resistance due to a fluorine content of a high concentration.

Additionally, ion implantation energy required during the implantation of $_{30}BF^+$ ions is 2.7 times as high as that required during the implantation of secondary ions (i.e., $_{11}B^+$ ions) of the mixed implantation.

FIGS. 4A to 4D are cross-sectional diagrams showing a first example of the manufacturing method of the PMOS device according to the first embodiment of the present invention.

Figure 4A:
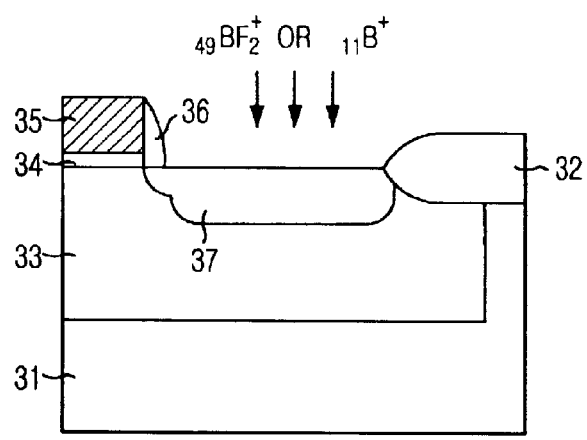
FIGS. 4A to 4D are cross-sectional diagrams showing a first example of the manufacturing method of the PMOS device according to the first embodiment of the present invention.

Referring to FIG. 4A, a field oxide layer 32 acting as a device isolation layer is formed on a predetermined portion of a semiconductor substrate 31 using a shallow trench isolation (STI) process or a locos oxidation of silicon (LOCOS) process.

Then, N-type dopants such as phosphorous (P) ions are implanted into the semiconductor substrate 31 to form an N-type well 33, and a gate insulating layer 34 and a gate electrode 35 are formed on the semiconductor substrate 31.

At this time, the gate insulating layer 34 is formed using any one of a thermal oxide layer, an oxynitride layer, a high dielectric layer and a stack layer of oxide layer/high dielectric layer. The gate electrode 35 is formed using any one of a polysilicon layer, a stack layer of polysilicon layer/silicide layer, a stack layer of polysilicon layer/metal layer, a silicon germanium layer, a stack layer of silicon germanium layer/metal layer, and a metal layer. A hard mask such as a silicon nitride layer can be further formed on the topmost portion.

After depositing an insulating layer on the semiconductor substrate 31, an etching process is performed to an entire surface to thereby form spacers 36 on both sidewalls of the gate electrode 35. At this time, the insulating layer forming the spacers 36 is formed using any one of a silicon oxide layer, a silicon oxide layer and a combination of silicon nitride layer and silicon oxide layer.

Then, P-type source/drain junction 37 is formed by implanting P-type dopants (e.g., $_{49}BF_2^+$ ions or $_{11}B^+$ ions) into the semiconductor substrate 31 disposed at outer sides of the spacers 36. At this time, the P-type source/drain junction 37 can have a source-drain extension (SDE) structure and can be formed using a well-known method. Meanwhile, a buried channel PMOS device can use a source/drain junction having no SDE structure.

Figure 4B:
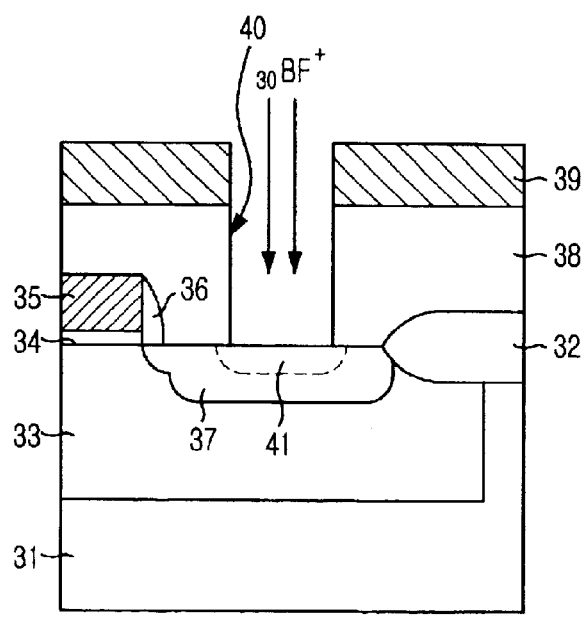

Referring to FIG. 4B, an intermediate insulating layer 38 is deposited on the semiconductor substrate 31. At this time, the intermediate insulating layer 38 is a gapfill boro phospho silicate glass (BPSG), a high density plasma chemical vapor deposition (HDP CVD) layer or a low dielectric layer, stacked on a silicon layer or a silicon nitride layer.

Then, a photoresist pattern 39 for exposing the P-type source/drain junction 37 is formed on the intermediate insulating layer 38 using a well-known photolithography method.

Then, the intermediate insulating layer 38 is etched using the photoresist pattern 39 as an etching mask to thereby form a contact hole 40. At this time, during the etching process for forming the contact hole 40, a surface of the P-type source/drain junction 37 may be damaged.

Then, in order to cure the damaged portion of the P-type source/drain junction 37 and secure the contact resistance, the plug implantation process is performed by implanting $_{30}BF^+$ ions by an amount of $1\times10^{15}$ ions/cm$^2$ to $5\times10^{15}$ ions/cm$^2$ to thereby amorphize the surface of the P-type source/drain junction 37. In other words, a plug implantation region 41 is formed within the P-type source/drain junction 37.

As is well known, since $_{30}BF^+$ ion has half the bonding number of fluorine as many as the $_{49}BF_2^+$ ion, the implantation amount of fluorine is only half under the condition of the same implantation amount, compared with the $_{49}BF_2^+$ ion implantation. Also, ion implantation energy required in the implantation of $_{30}BF^+$ ions so as to form the same depth is about 2.7 times as higher as that required in the implantation of $_{11}B$ ions.

As a result, the plug implantation region 41 formed by implanting $_{30}BF^+$ ions contains a small amount of fluorine and has a shallow junction.

Figure 4C:
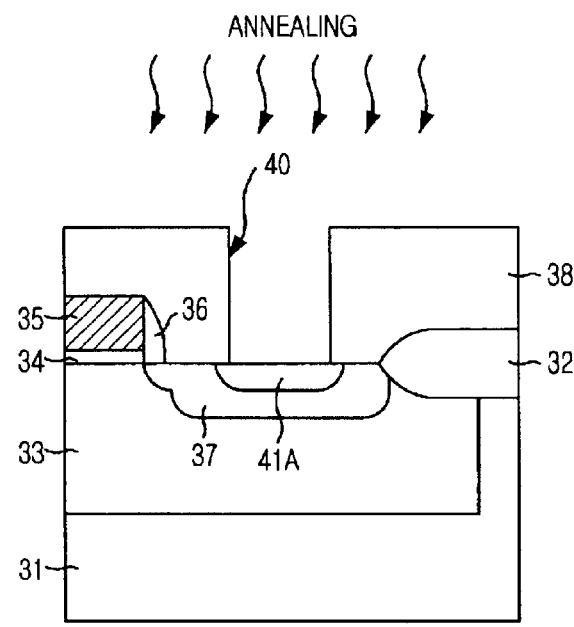

Referring to FIG. 4C, after removing the photoresist pattern 39, an activation annealing process for electrically activating the dopants implanted into the plug implantation region 41 is carried out to thereby form an activated plug implantation region 41A.

At this time, the activation annealing process is carried out in the range of 650° C. to 1150° C., which is lower than a melting point (1414° C.) of silicon and is a temperature for activating the dopants implanted into the plug implantation region 41. 40% or more of the fluorine ions implanted into the plug implantation region 41 during the activation annealing process are emitted to an exterior, so that the contact resistance becomes uniform without any influence of the fluorine compound during the following step of forming the silicide layer.

As a result, the plug implantation region 41A activated through the activation annealing process forms a stable bond between the ion-implanted dopant and the silicon, so that it is improved as an electrically activated P$^+$ doping layer. In other words, the fluorine is emitted during the activation annealing process and the stable bond between the boron (B) and the silicon (Si) is obtained.

Figure 4D:
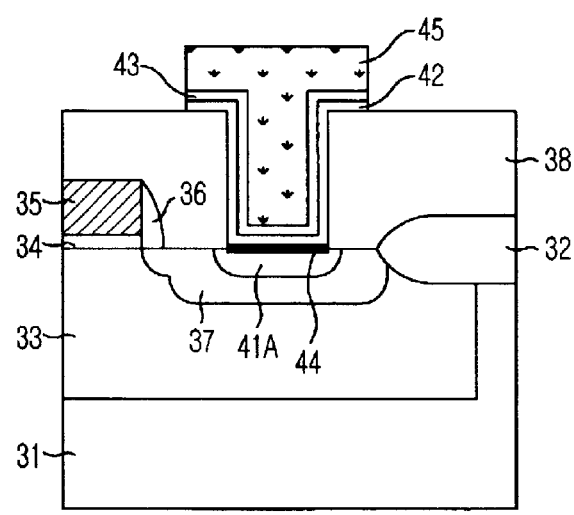

Referring to FIG. 4D, a metal layer 42 for forming a silicide and a diffusion preventing metal layer 43 are sequentially deposited on the intermediate insulating layer 39 including the contact hole 41. Then, a silicide layer 44 is formed by inducing a reaction between silicon atoms of the plug implantation region 41A and components of the metal layer 42 for forming the silicide.

Here, as is well known, the metal layer 42 for forming the silicide can be formed of a titanium (Ti) layer, a titanium silicon (TiSi$_x$) layer, a cobalt (Co) layer, a nickel (Ni) layer or a platinum (Pt) layer. The diffusion preventing metal layer 43 for preventing a mutual reaction between the metal interconnection and the P-type source/drain junction 37 can be formed of a titanium nitride (TiN) layer or a tungsten nitride (WN) layer.

For example, in case where the metal layer 42 for forming the silicide is formed of the titanium (Ti) layer and the diffusion preventing metal layer 43 is formed of the titanium nitride (TiN) layer, the silicide layer 44 can be formed by performing a rapid thermal process (RTP) at a temperature of 650° C. to 900° C. During the rapid thermal process (RTP), the silicon atoms contained in the plug implantation region 41A are reacted with the titanium atoms contained in the titanium layer (i.e., the metal layer 42), thereby forming the titanium silicide layer. As is well known, such a silicide layer 44 functions to easily form the ohmic contact used to reduce the contact resistance.

Meanwhile, the titanium nitride (TiN) layer acts as the diffusion preventing metal layer and simultaneously prevents the titanium (Ti) layer from being exposed on air. Additionally, the titanium nitride (TiN) layer functions to protect the titanium (Ti) layer from a formation of a native oxide layer and an occurrence of contamination, which are caused due to an exposure for a long time.

After forming the silicide layer 44, a metal layer, such as an aluminum (Al), an aluminum alloy, a tungsten (W), a copper (Cu) or a copper alloy, is deposited and then a metal interconnection 45 is formed through a patterning process for forming a metal interconnection. At this time, the diffusion preventing metal layer 43 and the metal layer 42, which are formed on the intermediate insulating layer 39, are patterned simultaneously during the patterning process.

In the above-described first example according to the first embodiment of the present invention, shown in FIG. 2, the P-type source/drain junction 37 is formed through an implantation of $_{49}BF_2^+$ ions and $_{11}B^+$ ions, and the plug implantation region 41 is formed through an implantation of $_{30}BF^+$ ions.

FIGS. 5A to 5D are cross-sectional diagrams showing a second example of the manufacturing method of the PMOS device according to the first embodiment of the present invention.

Figure 5A:
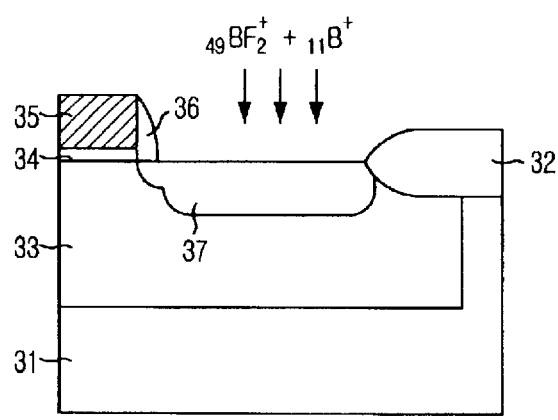
FIGS. 5A to 5D are cross-sectional diagrams showing a second example of the manufacturing method of the PMOS device according to the first embodiment of the present invention.

Referring to FIG. 5A, a field oxide layer 32 acting as a device isolation layer is formed on a predetermined portion of a semiconductor substrate 31 using a shallow trench isolation (STI) process or a locos oxidation of silicon (LOCOS) process.

Then, N-type dopants such as phosphorous (P) ions are implanted into the semiconductor substrate 31 to form an N-type well 33, and a gate insulating layer 34 and a gate electrode 35 are formed on the semiconductor substrate 31.

At this time, the gate insulating layer 34 is formed using any one of a thermal oxide layer, an oxynitride layer, a high dielectric layer and a stack layer of oxide layer/high dielectric layer. The gate electrode 35 is formed using any one of a polysilicon layer, a stack layer of polysilicon layer/silicide layer, a stack layer of polysilicon layer/metal layer, a silicon germanium layer, a stack layer of silicon germanium layer/metal layer, and a metal layer. A hard mask such as a silicon nitride layer can be further formed on the topmost portion.

After depositing an insulating layer on the semiconductor substrate 31, an etching process is performed to an entire surface to thereby form spacers 36 on both sidewalls of the gate electrode 35. At this time, the insulating layer forming the spacers 36 is formed using any one of a silicon oxide layer, a silicon oxide layer and a combination of silicon nitride layer and silicon oxide layer.

Then, P-type source/drain junction 37 of an SDE structure is formed by sequentially implanting $_{49}BF_2^+$ ions and $_{11}B^+$ ions into the semiconductor substrate 31 disposed at outer sides of the spacers 36. The SDE structure is formed through the ion implantation process before forming the spacers 36.

At this time, $_{49}BF_2^+$ ions are implanted by a smaller amount than a total implantation amount of dopants to be implanted into the P-type source/drain junction 37, but by an amount enough to form an amorphous layer on the semiconductor substrate. Therefore, since the fluorine (F) ions are implanted by a smaller amount than the case that the $_{49}BF_2^+$ ions are all implanted by a predetermined amount, a probability of causing a lattice defect is reduced.

Further, $_{11}B^+$ ions are implanted by the other implantation amount of dopants. At this time, since the $_{49}BF_2^+$ ions are previously implanted, the fluorine (F) ions contained in the $_{49}BF_2^+$ ions can be prevented from being diffused with $_{11}B^+$ ions. As a result, the P-type source/drain junction 37 can be prevented from being deepened.

Figure 5B:
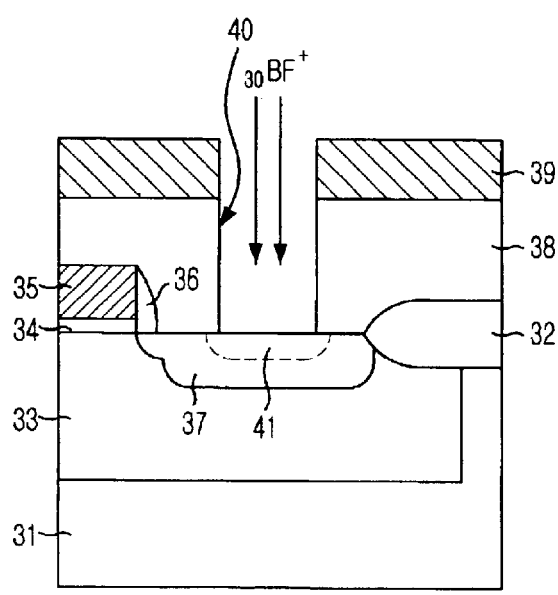

Referring to FIG. 5B, an intermediate insulating layer 38 is deposited on the semiconductor substrate 31. At this time, the intermediate insulating layer 38 is a gapfill boro phospho silicate glass (BPSG), a high density plasma chemical vapor deposition (HDP CVD) layer or a low dielectric layer, stacked on a silicon layer or a silicon nitride layer.

Then, a photoresist pattern 39 for exposing the P-type source/drain junction 37 is formed on the intermediate insulating layer 38 using a well-known photolithography method.

Then, the intermediate insulating layer 38 is etched using the photoresist pattern 39 as an etching mask to thereby form a contact hole 40. At this time, during the etching process for forming the contact hole 40, a surface of the P-type source/drain junction 37 may be damaged.

Then, in order to cure the damaged portion of the P-type source/drain junction 37 and secure the contact resistance, the plug implantation process is performed by implanting $_{30}BF^+$ ions by an amount of $1\times10^{15}$ ions/cm$^2$ to $5\times10^{15}$ ions/cm$^2$ to thereby amorphize the surface of the P-type source/drain junction 37. In other words, a plug implantation region 41 is formed within the P-type source/drain junction 37.

As is well known, since $_{30}BF^+$ ion has half the bonding number of fluorine as many as the $_{49}BF_2^+$ ion, the implantation amount of fluorine is only half under the condition of the same implantation amount, compared with the $_{49}BF_2^+$ ion implantation. Also, ion implantation energy required in the implantation of $_{30}BF^+$ ions so as to form the same depth is about 2.7 times as higher as that required in the implantation of $_{11}B$ ions.

As a result, the plug implantation region 41 formed by implanting $_{30}BF^+$ ions contains a small amount of fluorine and has a shallow junction.

Figure 5C:
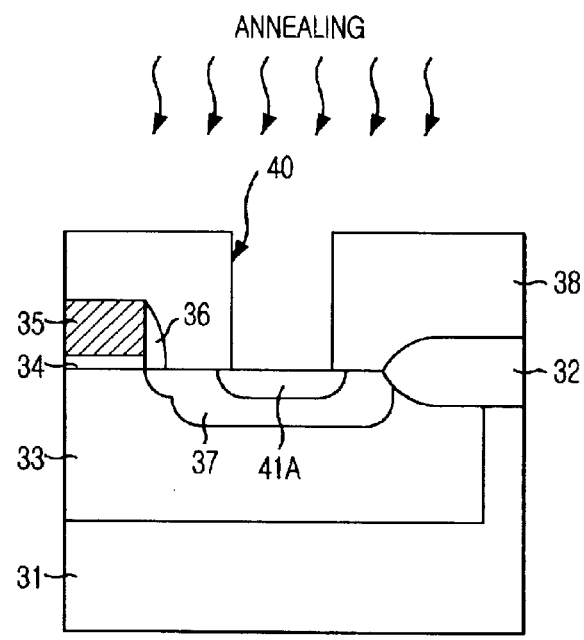

Referring to FIG. 5C, after removing the photoresist pattern 39, an activation annealing process for electrically activating the dopants implanted into the plug implantation region 41 is carried out to thereby form an activated plug implantation region 41A.

At this time, the activation annealing process is carried out in the range of 650° C. to 1150° C., which is lower than a melting point (1414° C.) of silicon and is a temperature for activating the dopants implanted into the plug implantation region 41. 40% or more of the fluorine ions implanted into the plug implantation region 41 during the activation annealing process are emitted to an exterior, so that the contact resistance becomes uniform without any influence of the fluorine compound during the following step of forming the silicide layer.

As a result, the plug implantation region 41A activated through the activation annealing process forms a stable bond between the ion-implanted dopant and the silicon, so that it is improved as an electrically activated P$^+$ doping layer. In other words, the fluorine is emitted during the activation annealing process and the stable bond between the boron (B) and the silicon (Si) is obtained.

Figure 5D:
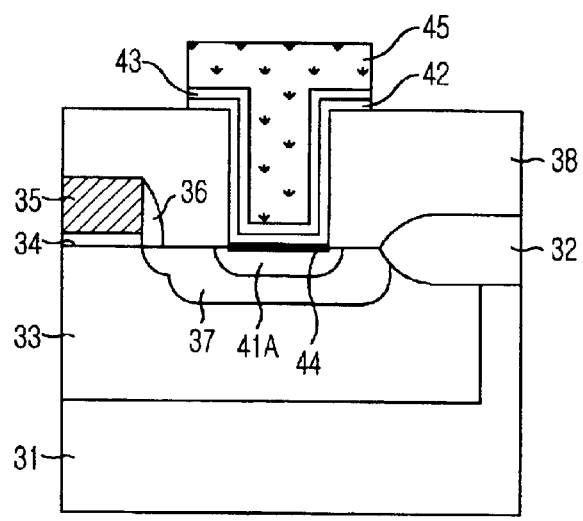

Referring to FIG. 5D, a metal layer 42 for forming a silicide and a diffusion preventing metal layer 43 are sequentially deposited on the intermediate insulating layer 39 including the contact hole 41. Then, a silicide layer 44 is formed by inducing a reaction between silicon atoms of the plug implantation region 41A and components of the metal layer 42 for forming the silicide.

Here, as is well known, the metal layer 42 for forming the silicide can be formed of a titanium (Ti) layer, a titanium silicon (TiSi$_x$) layer, a cobalt (Co) layer, a nickel (Ni) layer or a platinum (Pt) layer. The diffusion preventing metal layer 43 for preventing a mutual reaction between the metal interconnection and the P-type source/drain junction 37 can be formed of a titanium nitride (TiN) layer or a tungsten nitride (WN) layer.

For example, in case where the metal layer 42 for forming the silicide is formed of the titanium (Ti) layer and the diffusion preventing metal layer 43 is formed of the titanium nitride (TiN) layer, the silicide layer 44 can be formed by performing a rapid thermal process (RTP) at a temperature of 650° C. to 900° C. During the rapid thermal process (RTP), the silicon atoms contained in the plug implantation region 41A are reacted with the titanium atoms contained in the titanium layer (i.e., the metal layer 42), thereby forming the titanium silicide layer. As is well known, such a silicide layer 44 functions to easily form the ohmic contact used to reduce the contact resistance.

Meanwhile, the titanium nitride (TiN) layer acts as the diffusion preventing metal layer and simultaneously prevents the titanium (Ti) layer from being exposed on air. Additionally, the titanium nitride (TiN) layer functions to protect the titanium (Ti) layer from a formation of a native oxide layer and an occurrence of contamination, which are caused due to an exposure for a long time.

After forming the silicide layer 44, a metal layer, such as an aluminum (Al), an aluminum alloy, a tungsten (W), a copper (Cu) or a copper alloy, is deposited and then a metal interconnection 45 is formed through a patterning process for forming a metal interconnection. At this time, the diffusion preventing metal layer 43 and the metal layer 42, which are formed on the intermediate insulating layer 39, are patterned simultaneously during the patterning process.

In the above-described second example according to the first embodiment of the present invention, the P-type source/drain junction 37 is formed through a mixed implantation of $_{49}BF_2^+$ ions and $_{11}B^+$ ions, and the plug implantation region 41 is formed through an implantation of $_{30}BF^+$ ions. Therefore, compared with the first example of FIGS. 4A to 4D, the second example can form the junction containing a small amount of fluorine ions and have a shallow junction.

FIGS. 6A to 6D are cross-sectional diagrams showing a third example of the manufacturing method of the PMOS device according to the first embodiment of the present invention.

Figure 6A:
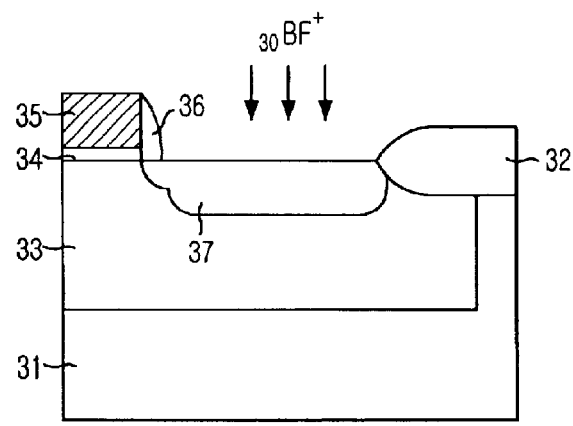
FIGS. 6A to 6D are cross-sectional diagrams showing a third example of the manufacturing method of the PMOS device according to the first embodiment of the present invention.

Referring to FIG. 6A, a field oxide layer 32 acting as a device isolation layer is formed on a predetermined portion of a semiconductor substrate 31 using a shallow trench isolation (STI) process or a locos oxidation of silicon (LOCOS) process.

Then, N-type dopants such as phosphorous (P) ions are implanted into the semiconductor substrate 31 to form an N-type well 33, and a gate insulating layer 34 and a gate electrode 35 are formed on the semiconductor substrate 31.

At this time, the gate insulating layer 34 is formed using any one of a thermal oxide layer, an oxynitride layer, a high dielectric layer and a stack layer of oxide layer/high dielectric layer. The gate electrode 35 is formed using any one of a polysilicon layer, a stack layer of polysilicon layer/silicide layer, a stack layer of polysilicon layer/metal layer, a silicon germanium layer, a stack layer of silicon germanium layer/metal layer, and a metal layer. A hard mask such as a silicon nitride layer can be further formed on the topmost portion.

After depositing an insulating layer on the semiconductor substrate 31, an etching process is performed to an entire surface to thereby form spacers 36 on both sidewalls of the gate electrode 35. At this time, the insulating layer forming the spacers 36 is formed using any one of a silicon oxide layer, a silicon oxide layer and a combination of silicon nitride layer and silicon oxide layer.

Then, P-type source/drain junction 37 of an SDE structure is formed by implanting $_{30}BF^+$ ions into the semiconductor substrate 31 disposed at outer sides of the spacers 36.

Figure 6B:
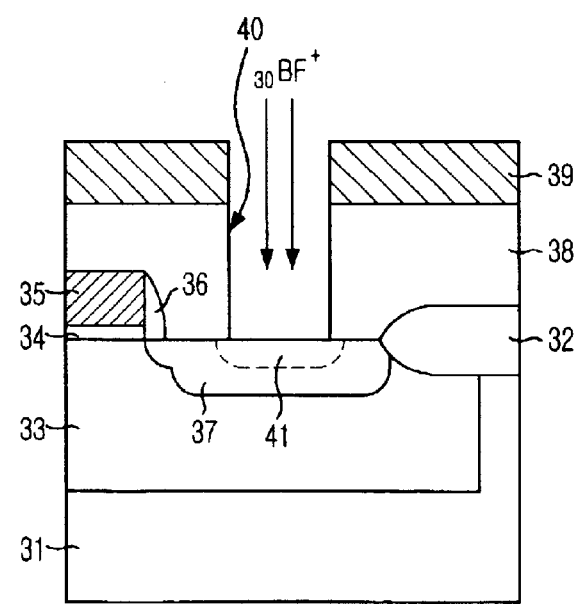

Referring to FIG. 6B, an intermediate insulating layer 38 is deposited on the semiconductor substrate 31. At this time, the intermediate insulating layer 38 is a gapfill boro phospho silicate glass (BPSG), a high density plasma chemical vapor deposition (HDP CVD) layer or a low dielectric layer, stacked on a silicon layer or a silicon nitride layer.

Then, a photoresist pattern 39 for exposing the P-type source/drain junction 37 is formed on the intermediate insulating layer 38 using a well-known photolithography method.

Then, the intermediate insulating layer 38 is etched using the photoresist pattern 39 as an etching mask to thereby form a contact hole 40. At this time, during the etching process for forming the contact hole 40, a surface of the P-type source/drain junction 37 may be damaged.

Then, in order to cure the damaged portion of the P-type source/drain junction 37 and secure the contact resistance, the plug implantation process is performed by implanting $_{30}BF^+$ ions by an amount of $1\times10^{15}$ ions/cm$^2$ to $5\times10^{15}$ ions/cm$^2$ to thereby amorphize the surface of the P-type source/drain junction 37. In other words, a plug implantation region 41 is formed within the P-type source/drain junction 37.

As is well known, since $_{30}BF^+$ ion has half the bonding number of fluorine as many as the $_{49}BF_2^+$ ion, the implantation amount of fluorine is only half under the condition of the same implantation amount, compared with the $_{49}BF_2^+$ ion implantation. Also, ion implantation energy required in the implantation of $_{30}BF^+$ ions so as to form the same depth is about 2.7 times as higher as that required in the implantation of $_{11}B$ ions.

As a result, the plug implantation region 41 and the plug implantation region 41, which are formed by implanting $_{30}BF^+$ ions, contain a small amount of fluorine and have a shallow junction.

Figure 6C:
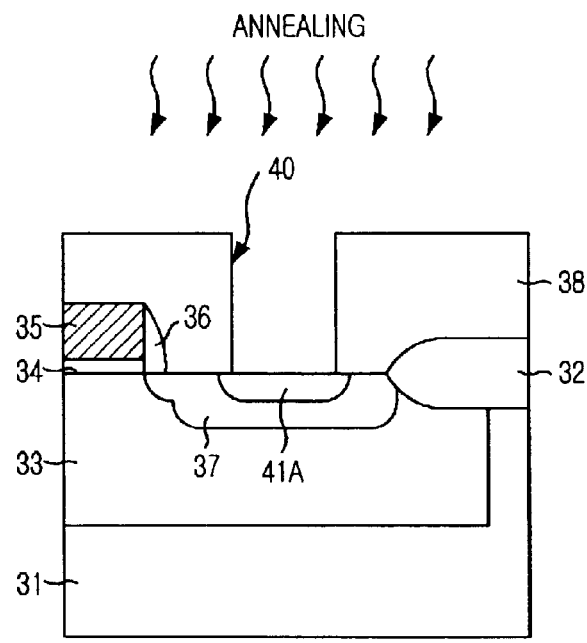

Referring to FIG. 6C, after removing the photoresist pattern 39, an activation annealing process for electrically activating the dopants implanted into the plug implantation region 41 is carried out to thereby form an activated plug implantation region 41A.

At this time, the activation annealing process is carried out in the range of 650° C. to 1150° C., which is lower than a melting point (1414° C.) of silicon and is a temperature for activating the dopants implanted into the plug implantation region 41. 40% or more of the fluorine ions implanted into the plug implantation region 41 during the activation annealing process are emitted to an exterior, so that the contact resistance becomes uniform without any influence of the fluorine compound during the following step of forming the silicide layer.

As a result, the plug implantation region 41A activated through the activation annealing process forms a stable bond between the ion-implanted dopant and the silicon, so that it is improved as an electrically activated P$^+$ doping layer. In other words, the fluorine is emitted during the activation annealing process and the stable bond between the boron (B) and the silicon (Si) is obtained.

Figure 6D:
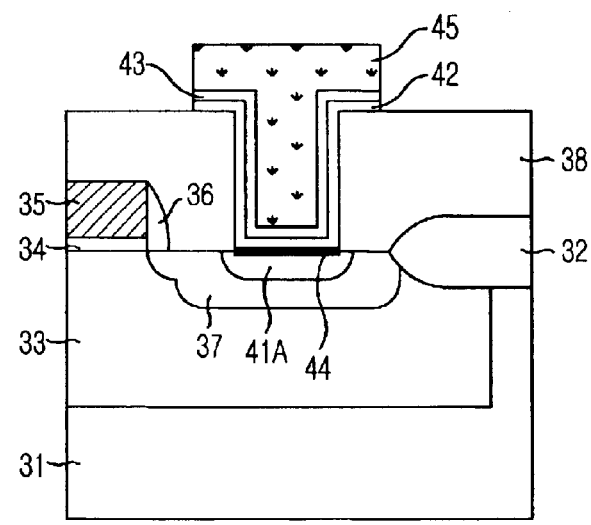

Referring to FIG. 6D, a metal layer 42 for forming a silicide and a diffusion preventing metal layer 43 are sequentially deposited on the intermediate insulating layer 39 including the contact hole 41. Then, a silicide layer 44 is formed by inducing a reaction between silicon atoms of the plug implantation region 41A and components of the metal layer 42 for forming the silicide.

Here, as is well known, the metal layer 42 for forming the silicide can be formed of a titanium (Ti) layer, a titanium silicon (TiSi$_x$) layer, a cobalt (Co) layer, a nickel (Ni) layer or a platinum (Pt) layer. The diffusion preventing metal layer 43 for preventing a mutual reaction between the metal interconnection and the P-type source/drain junction 37 can be formed of a titanium nitride (TiN) layer or a tungsten nitride (WN) layer.

For example, in case where the metal layer 42 for forming the silicide is formed of the titanium (Ti) layer and the diffusion preventing metal layer 43 is formed of the titanium nitride (TiN) layer, the silicide layer 44 can be formed by performing a rapid thermal process (RTP) at a temperature of 650° C. to 900° C. During the rapid thermal process (RTP), the silicon atoms contained in the plug implantation region 41A are reacted with the titanium atoms contained in the titanium layer (i.e., the metal layer 42), thereby forming the titanium silicide layer. As is well known, such a silicide layer 44 functions to easily form the ohmic contact used to reduce the contact resistance.

Meanwhile, the titanium nitride (TiN) layer acts as the diffusion preventing metal layer and simultaneously prevents the titanium (Ti) layer from being exposed on air. Additionally, the titanium nitride (TiN) layer functions to protect the titanium (Ti) layer from a formation of a native oxide layer and an occurrence of contamination, which are caused due to an exposure for a long time.

After forming the silicide layer 44, a metal layer, such as an aluminum (Al), an aluminum alloy, a tungsten (W), a copper (Cu) or a copper alloy, is deposited and then a metal interconnection 45 is formed through a patterning process for forming a metal interconnection. At this time, the diffusion preventing metal layer 43 and the metal layer 42, which are formed on the intermediate insulating layer 39, are patterned simultaneously during the patterning process.

In the above-described third example according to the first embodiment of the present invention, both the P-type source/drain junction 37 and the plug implantation region 41 are formed through an implantation of $_{30}BF_2^+$ ions.

Therefore, compared with the first example, the third example can form the junction containing a small amount of fluorine ions and have a shallow junction.

Although it is not shown, the manufacturing method of the semiconductor device according to the second embodiment of the present invention is the same as that according to the first embodiment, in that the P-type source/drain junction is formed by implanting $_{49}BF_2^+$ ions, $_{11}B^+$ ions, a mixture of $_{49}BF_2^+$ ions and $_{11}B^+$, or $_{30}BF^+$ ions, and the plug implantation region is formed by implanting $_{30}BF^+$ ions. However, the difference is that the activation of the dopants implanted into the plug implantation region is achieved during the annealing process for forming the following silicide layer. In this case, compared with the first embodiment, since the second embodiment can penetrate a larger amount of fluorine into the silicide layer in forming the silicide layer, a low contact resistance can be obtained by simultaneously performing the ion implantation containing a small amount of fluorine. Additionally, it is possible to simplify a manufacturing process.

Figure 7:
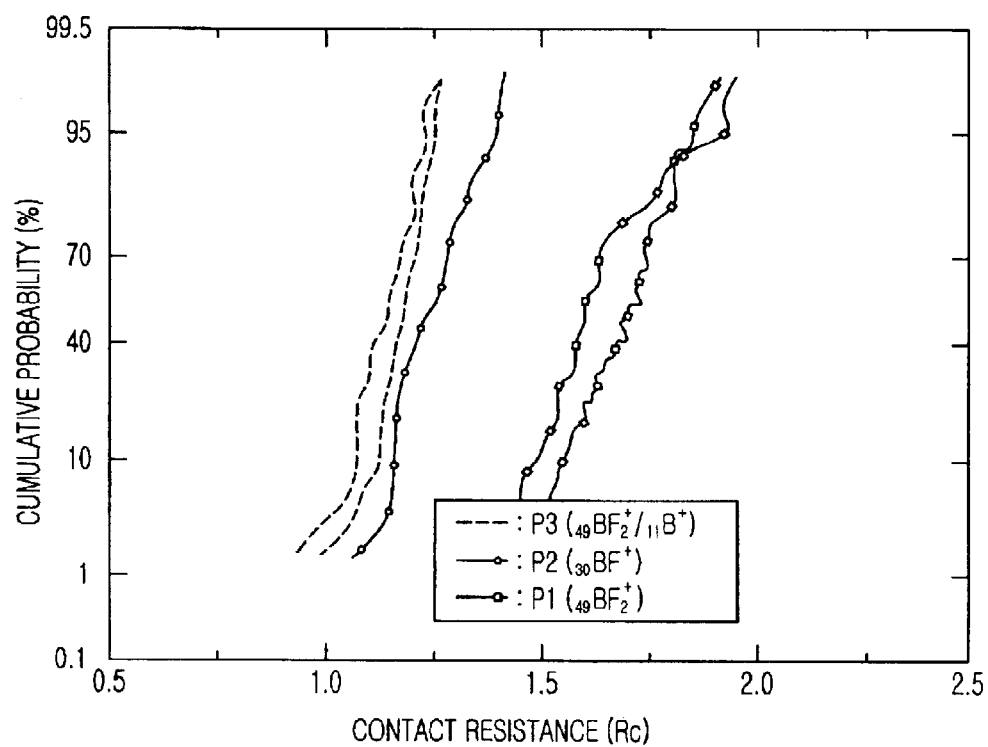
FIG. 7 is a graph showing a contact resistance distribution according to an application of different ion implantations from each other.

FIG. 7 is a graph showing contact resistance distributions according to an application of different ion implantation methods, comparing contact resistance distributions of metal interconnection /TiN/TiSi$_2$/P-type source/drain junction whose the P-type source/drain junction implantation and the plug implantation are implemented by the $_{49}BF_2^+$ ion implantation method (P1), the $_{30}BF^+$ ion implantation method (P2), and the mixed implantation method (P3) of $_{49}BF_2^+$ and $_{11}B^+$.

Referring to FIG. 7, in case of the $_{49}BF_2^+$ ion implantation method (P1) having a largest initial implantation amount of fluorine, the contact resistance distribution is worst. In case of the mixed implantation method (P3) of $_{49}BF_2^+$ and $_{11}B^+$ having a smallest initial implantation amount of fluorine, the contact resistance distribution is best. It can be seen that the contact resistance distribution of the $_{30}BF^+$ ion implantation method (P2) is much better than that of the $_{49}BF_2^+$ ion implantation method (P1) and similar to that of the mixed implantation method (P3) of $_{49}BF_2^+$ and $_{11}B^+$. This means that fluorine ions influence the contact resistance greatly.

According to the result of FIG. 7, although the mixed implantation method (P3) of $_{49}BF_2^+$ and $_{11}B^+$ is best in view of the characteristic of the contact resistance distribution, there is a disadvantage that the mixed implantation requires a lower energy of 5 KeV or less so that productivity is degraded.

Accordingly, if the productivity is considered, the $_{30}BF^+$ ion implantation method (P2) may be more excellent technique.

That is, in case of implanting $_{11}B^+$ ions, a very shallow ion implantation depth is required for the shallow junction. For this, it is necessary to purchase an additional apparatus for extremely low energy ion implantation, thereby causing a heavy burden of cost. Meanwhile, since the $_{30}BF^+$ ion implantation method (P2) uses the ion implantation energy 2.7 times as high as the implantation of $_{11}B^+$ ions, it is possible to extract higher ion beam current. Accordingly, the shallow junction can be formed in a typical ion implantation apparatus without any purchase of an additional apparatus.

Further, while the mixed implantation method (P3) of $_{49}BF_2^+$ and $_{11}B^+$ requires an exchange process of $_{49}BF_2^+$ ions to $_{11}B^+$ ions, the $_{30}BF^+$ ion implantation method (P2) does not require the exchange process, thereby improving the productivity.

Furthermore, while the pre-amorphization process method and the low energy boron ion implantation method easily contaminates an ion source region of the ion implantation apparatus so that an exchange of the ion source and an inspection period of the apparatus are very short, the $_{30}BF^+$ ion implantation method (P2) has a relative long inspection period of the ion source, thereby minimizing a discharge of environmental contamination material generated in the inspection of the ion source.

Although the case of forming the metal interconnection connected with the source/drain junction without any contact plug is described in the above-described embodiments, the present invention is also applicable to the case of forming a metal interconnection having the contact plug.

Additionally, in addition to the contact connected to the source/drain junction, the present invention is also applicable to the case of forming a contact connected to a gate electrode or an active area.

While the present invention has been described with respect to certain preferred embodiments only, other modifications and variation may be made without departing from the spirit and scope of the present invention as set forth in the following claims.

By forming the plug implantation region containing a small amount of fluorine ions, the present invention can satisfy the contact resistance required in the high integration device of 100 nm or less, whose contact size is extremely small, thereby securing yield of the high integration device.

Since the present invention utilizes the $_{30}BF^+$ ion implantation method (P2) which can use the ion implantation energy 2.7 times as high as the implantation of $_{11}B^+$ ions, it is possible to extract higher ion beam current and increase the productivity. Also, since the typical ion implantation apparatus can be used, it is possible to manufacture high performance devices at a low cost.

Further, the present invention has a relative long inspection period of the ion source, thereby minimizing a discharge of environmental contamination material generated in the inspection of the ion source.

What is claimed is:

1. A method for forming a contact of a semiconductor device, comprising the steps of:

forming an insulating layer on a conductive semiconductor layer, the conductive semiconductor layer having a source/drain region formed by implanting one of $_{49}BF_2^+$ ions, mixed ions of $_{49}BF_2^+$ and $_{11}B^+$, and $_{30}BF^+$ ions into the conductive semiconductor layer;

forming a contact hole within the insulating layer to expose a partial area of the source/drain region;

forming a plug implantation region by implanting $_{30}BF^+$ ions into the partial area of the source/drain region;

performing an annealing process for activating dopants injected by the implantation of $_{30}BF^+$ ions; and filling the contact hole with a conductive layer.

2. The method as recited in claim 1, wherein the conductive semiconductor layer includes a gate electrode.

3. The method as recited in claim 1, wherein the annealing process is carried out at a temperature of about 650° C. to about 1150° C.

4. The method as recited in claim 1, wherein an amount of $_{30}BF^+$ ions to be implanted at the step of forming the plug implantation region is about $1 \times 10^{15}$ ions/cm2 to about $5 \times 10^{15}$ ions/cm2.

5. A method for forming a contact of a semiconductor device, comprising the steps of:

forming an insulating layer on a conductive semiconductor layer, the conductive semiconductor layer having a source/drain region formed by implanting one of $_{49}BF_2^+$ ions, mixed ions of $_{49}BF_2^+$ and $_{11}B^+$, and $_{30}BF^+$ ions into the conductive semiconductor layer;

forming a contact hole within the insulating layer to expose a partial area of the source/drain region;

forming a plug implantation region by implanting $_{30}BF^+$ ions into the partial area of the source/drain region;

forming a metal layer within the contact hole and on a portion of a surface of the insulating layer and forming a diffusion preventing metal layer on the metal layer;

forming a silicide layer contacted with the plug implantation region by performing an annealing process and simultaneously activating dopants implanted into the plug implantation region; and filling the contact hole with a conductive layer.

6. The method as recited in claim 5, wherein the silicide layer is formed by performing the annealing process at a temperature of about 650° C. to about 900° C.

7. The method as recited in claim 5, wherein the conductive semiconductor layer includes a gate electrode.

8. The method as recited in claim 5, wherein an amount of $_{30}BF^+$ ions to be implanted at the step of forming the plug implantation region is about $1 \times 10^{15}$ ions/cm2 to about $5 \times 10^{15}$ ions/cm2.

9. A method for manufacturing a P-type metal oxide semiconductor (PMOS) device, comprising the steps of:

forming a P-type source/drain region on a semiconductor substrate by implanting one of $_{49}BF_2^+$ ions, mixed ions of $_{49}BF_2^+$ and $11B^+$, and $_{30}BF^+$ ions into the semiconductor substrate;

forming an insulating layer on the semiconductor substrate covering an exposed portion of the P-type source/drain region;

etching the insulating layer to form a contact hole exposing a partial area of the P-type source/drain region;

implanting $_{30}BF^+$ ions into the partial area of the P-type source/drain region to form a plug implantation region;

forming a diffusion preventing metal layer within the contact hole and on a portion of the insulating layer; and forming a metal interconnection electrically connected to the P-type source/drain region on the diffusion preventing metal layer.

10. The method as recited in claim 9, wherein an amount of $_{30}BF^+$ ions to be implanted at the step of forming the plug implantation region is about $1 \times 10^{15}$ ions/cm2 to about $5 \times 10^{15}$ ions/cm2.

11. The method as recited in claim 9, after the step of implanting $_{30}BF^+$ ions, further comprising the step of electrically activating dopants implanted into the P-type source/drain region by performing an annealing process.

12. The method as recited in claim 11, wherein the annealing process is carried out at a temperature of about 650° C. to about 1150° C.

* * * * *